United States Patent
Li et al.

(10) Patent No.: US 10,727,446 B2
(45) Date of Patent: Jul. 28, 2020

(54) OLED ARRAY SUBSTRATE WITH MICROCAVITY STRUCTURE, AND OLED DISPLAY PANEL

(71) Applicant: BOE TECHNOLOGY GROUP CO., LTD., Beijing (CN)

(72) Inventors: Wei Li, Beijing (CN); Youngsuk Song, Beijing (CN); Jianye Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/538,637

(22) PCT Filed: Jan. 12, 2017

(86) PCT No.: PCT/CN2017/070955
§ 371 (c)(1),
(2) Date: Jun. 21, 2017

(87) PCT Pub. No.: WO2017/121351
PCT Pub. Date: Jul. 20, 2017

(65) Prior Publication Data
US 2018/0358578 A1    Dec. 13, 2018

(30) Foreign Application Priority Data
Jan. 15, 2016    (CN) .......................... 2016 1 0026032

(51) Int. Cl.
*H01L 51/52*    (2006.01)
*H01L 21/77*    (2017.01)
(Continued)

(52) U.S. Cl.
CPC .......... *H01L 51/5271* (2013.01); *H01L 21/77* (2013.01); *H01L 27/322* (2013.01);
(Continued)

(58) Field of Classification Search
CPC ............. H01L 51/5265; H01L 51/5271; H01L 27/3211–3218
See application file for complete search history.

(56) References Cited

U.S. PATENT DOCUMENTS 7,598,671 B2 * 10/2009 Song ................... H01L 51/5265
                                                              313/498
2004/0155576 A1 * 8/2004 Tyan ................... H01L 51/5265
                                                              313/504
(Continued)

FOREIGN PATENT DOCUMENTS

CN    1604706 A    4/2005
CN    1839478 A    9/2006
(Continued)

OTHER PUBLICATIONS

Machine Translation of IDS Reference, KR 10-2010-0052810 (Year: 2015).*
(Continued)

*Primary Examiner* — Daniel Whalen
*Assistant Examiner* — Suberr L Chi
(74) *Attorney, Agent, or Firm* — Womble Bond Dickinson (US) LLP

(57) ABSTRACT

The present disclosure provides an OLED array substrate comprising a plurality of pixel units each including a plurality of sub-pixel units, each of the sub-pixel units comprising a light-emitting portion, each light-emitting portion having a first electrode, a second electrode and an organic light-emitting layer sandwiched between the first electrode and the second electrode, wherein the sub-pixel unit further comprises an organic film layer and a semi-reflecting mirror layer disposed successively on a light exit side of the second electrode, the first electrode comprises a reflective layer, the second electrode is a transparent electrode, a structure between the first electrode and the semi-reflecting mirror (Continued)

layer constitutes a microcavity structure, and organic film layers of the sub-pixel units of different colors of each pixel unit have different thicknesses. The present disclosure further provides an OLED display panel, an OLED display device, and a method of manufacturing the array substrate.

16 Claims, 2 Drawing Sheets

(51) Int. Cl.
    *H01L 27/32*     (2006.01)
    *H01L 51/00*     (2006.01)
    *H01L 51/56*     (2006.01)

(52) U.S. Cl.
    CPC ...... *H01L 27/3246* (2013.01); *H01L 51/0003* (2013.01); *H01L 51/5253* (2013.01); *H01L 51/5265* (2013.01); *H01L 51/56* (2013.01); *H01L 2227/323* (2013.01)

(56) References Cited

U.S. PATENT DOCUMENTS

| | | |
|---|---|---|
| 2004/0217700 A1 | 11/2004 | Chang |
| 2005/0040756 A1 | 2/2005 | Winters et al. |
| 2005/0067945 A1 | 3/2005 | Nishikawa et al. |
| 2009/0278450 A1 | 11/2009 | Sonoyama et al. |
| 2010/0320446 A1 | 12/2010 | Kang et al. |
| 2011/0175533 A1* | 7/2011 | Holman ............ E04B 9/32 315/130 |
| 2013/0181193 A1 | 7/2013 | Moon |
| 2014/0167015 A1* | 6/2014 | Lee ............ H01L 51/5012 257/40 |
| 2015/0188067 A1* | 7/2015 | Lee ............ H01L 51/5012 257/40 |
| 2016/0358979 A1* | 12/2016 | Wu ............ H01L 51/56 |
| 2017/0025641 A1 | 1/2017 | Zhang et al. |

FOREIGN PATENT DOCUMENTS

| | | |
|---|---|---|
| CN | 101606436 A | 12/2009 |
| CN | 103928624 A | 7/2014 |
| CN | 105161631 A | 12/2015 |
| CN | 105489632 A | 4/2016 |
| CN | 205609528 U | 9/2016 |
| KR | 10-2010-0052810 A | 5/2010 |
| KR | 10-2013-0036300 A | 4/2013 |
| KR | 10-2014-0066607 A | 6/2014 |
| KR | 10-2015-0047035 A | 5/2015 |

OTHER PUBLICATIONS

Human translation of Yang et al., KR 10-2010-0052810, 2010.*
International Search Report and Written Opinion in PCT/CN2017/070955 dated Mar. 31, 2017, with English translation.
Office Action received for Korean Patent Application No. 10-2017-7017712, dated Jun. 28, 2018, 13 pages (6 pages of English Translation and 7 pages of Office Action).
International Preliminary Report on Patentability received for PCT Patent Application No. PCT/CN2017/070955, dated Jul. 26, 2018, 11 pages (6 pages of English Translation and 5 pages of Original Document).
Office Action received for Korean Patent Application No. 10-2017-7017712, dated Jan. 25, 2019, 13 pages (6 pages of English Translation and 7 pages of Office Action).
Office Action received for Chinese Patent Application No. 201610026032.8, dated Dec. 20, 2017, 16 pages (8 pages of English Translation and 8 pages of Office Action).
IBM, "Vertical-Cavity Organic Light-Emitting Diode Display", Technical Disclosure Bulletin, vol. 40, No. 9, International Business Machines Corp., Sep. 1997, pp. 165-167.
Supplementary European Search Report and Written Opinion received for EP Patent Application No. 17729749.6, dated Jul. 3, 2019, 8 pages.

* cited by examiner

OLED ARRAY SUBSTRATE WITH MICROCAVITY STRUCTURE, AND OLED DISPLAY PANEL

RELATED APPLICATION

The present application is the U.S. national phase entry of PCT/CN2017/070955, with an international filing date of Jan. 12, 2017, which claims the benefit of Chinese Patent Application No. 201610026032.8, filed on Jan. 15, 2016, the entire disclosure of which is incorporated herein by reference.

FIELD

The present disclosure relates to the field of display technology, and specifically to an organic light-emitting diode (OLED) array substrate having a microcavity structure, a manufacturing method thereof, an OLED display panel, and an OLED display device.

BACKGROUND

An organic light-emitting diode (OLED) display device is an apparatus that realizes graphical display using the reversible color change phenomenon generated by an organic semiconductor material under the driving of a current. The OLED display device has advantages such as being ultra-light and ultra-thin, having high brightness, large viewing angle, low voltage, low power consumption, fast response and high definition, being anti-seismic and bendable, having low cost and simple process, using less raw material, having high luminous efficiency and wide temperature range, and so on, which is considered to be the most promising new generation display technology.

However, since the emission spectrum of the OLED luminous material is relatively wide and cannot satisfy the color purity of a desired light source, the luminous efficiency and brightness of the OLED are restricted, thereby causing the corresponding display device to have a low contrast and resulting in poor display effect.

SUMMARY

It is an objective of the present disclosure to provide an OLED array substrate, a manufacturing method thereof, an OLED display panel and an OLED display device, which are capable of at least partially alleviating or eliminating the problems in the prior art as mentioned above.

According to a first aspect of the present disclosure, there is provided an OLED array substrate comprising a plurality of pixel units each including a plurality of sub-pixel units, each of the sub-pixel units comprising a light-emitting portion, each light-emitting portion having a first electrode remote from a light exit side, a second electrode close to the light exit side and an organic light-emitting layer sandwiched between the first electrode and the second electrode, wherein the sub-pixel unit further comprises an organic film layer and a semi-reflecting mirror layer disposed successively on a light exit side of the second electrode. The first electrode comprises a reflective layer, the second electrode is a transparent electrode, a structure between the first electrode and the semi-reflecting mirror layer constitutes a microcavity structure, and organic film layers of the sub-pixel units of different colors of each pixel unit have different thicknesses. For example, when the pixel unit is a typical RGB pixel unit, the organic film layers of a red sub-pixel unit (R), a green sub-pixel unit (G) and a blue sub-pixel unit (B) have different thicknesses. Alternatively, when the pixel unit is an RGBG pixel unit, the organic film layers of two green sub-pixel units (G) may have the same thickness.

As used herein, the term "semi-reflecting mirror layer" relates to an optical layer having both reflective and transmissive properties. Although it is referred to as a "semi"-reflecting mirror layer, light incident on the semi-reflecting mirror layer can be reflected and transmitted in any proportion, which is not limited to being 50% reflected and 50% transmitted strictly.

In the above array substrate, light generated by the organic light-emitting layer undergoes reflection, total reflection, interference, diffraction or scattering in the microcavity structure delimited by the first electrode and the semi-reflecting mirror layer. A part of the light exits the semi-reflecting mirror layer, and the direction and intensity of the exit light depends on the properties of the microcavity structure. In other words, parameters of the microcavity structure can be designed according to the properties of the light generated by the organic light-emitting layer and the desired direction and intensity of the exit light. According to the present disclosure, by introducing the microcavity structure, the color purity of the exit light can be improved, and the luminous efficiency and brightness of the display device can be enhanced, thereby obtaining a display device with high contrast and low energy consumption. At the same time, the light emitted from the microcavity structure has a good directivity and a high color purity, so that a subsequent black matrix process is not required, which greatly increases the aperture ratio of the display device while saving the cost.

As used herein, the term "microcavity" or "microcavity structure" mainly refers to a microcavity with an echo wall pattern. Such a microcavity is an optical resonant cavity of the order of microns or submicrons, which limits light within a very small wavelength region by means of the effect such as reflection, total reflection, interference, diffraction or scattering on an interface with discontinuous refractive index. By designing the cavity length and optimizing the thicknesses of the layers in the cavity, the light-emitting center is located near the antinode of the standing wave field in the cavity, which can increase the coupling efficiency of the device's radiation dipole and the electric field in the cavity, thereby improving the luminous efficiency and brightness of the device.

According to an embodiment of the present disclosure, the thickness of the organic film layer can be designed according to the effective cavity length of the microcavity structure, the full width at half maximum of the emission peak and the Fabry-Perot formula. Specifically, the effective cavity length L(λ) of the microcavity structure is calculated by the following formula:

$$L(\lambda) \approx \frac{\lambda}{2}\left(\frac{R}{\Delta n}\right) + \sum_j n_j d_j \cos\theta + \left|\frac{\Phi_m}{4\pi}\lambda\right| \quad (1)$$

where λ is a resonant wavelength of light emitted from a corresponding light-emitting portion, R is an effective reflectance of the first electrode, Δn is a difference between refractive indexes of two materials that form the semi-reflecting mirror layer and the first electrode, $n_j$ and $d_j$ are a refractive index and a thickness of a material of the j-th layer, respectively, $\Phi_m$ is a reflection-induced retardance of light on the semi-reflecting mirror layer, and the term $$\sum_j n_j d_j \cos\theta$$

takes into account all the layers sandwiched between the first electrode and the semi-reflecting mirror layer.

The full width at half maximum $\Delta\lambda$ of the emission peak is calculated by the following formula:

$$\Delta\lambda = \frac{\lambda^2}{2nL(\lambda)} \times \frac{1-\sqrt{R_1 R_2}}{\pi(R_1 R_2)^{1/4}} \qquad (2)$$

where $\lambda$ is a resonant wavelength of light emitted from a corresponding light-emitting portion, R is an effective reflectance of the first electrode, $L(\lambda)$ is the effective cavity length of the microcavity structure calculated according to the formula (1), and $R_1$, $R_2$ are specular reflectances of the first electrode and the semi-reflecting mirror layer, respectively.

In the above formulas (1) and (2), the effective cavity length $L(\lambda)$ of the microcavity structure, the thickness of the organic film layer, and the full width at half maximum $\Delta\lambda$ of the emission peak are unknown, and other quantities are known or can be measured by those skilled in the art using conventional experimental measures.

The range of the thickness of the organic film layer can be defined by the Fabry-Perot formula:

$$(\varphi_1 + \varphi_2) + \frac{4\pi}{\lambda}\sum_j n_j d_j \cos\left[\arcsin\left(\frac{\sin\theta}{n_j}\right)\right] = 2m\pi \qquad (3)$$

where m is a nonnegative integer (e.g. 1, 2, etc), $\varphi_1$ and $\varphi_2$ are reflection-induced retardances of the first electrode and the semi-reflecting mirror layer, the units of which are radian, $n_j$ and $d_j$ are a refractive index and a thickness of the j-th layer, respectively, $$\arcsin\left(\frac{\sin\theta}{n_j}\right)$$

is an angle of light in the j-th layer measured from a normal line perpendicular to the plane of the light-emitting portion, $\lambda$ is a resonant wavelength of light emitted from the light-emitting portion, and the term $$\frac{4\pi}{\lambda}\sum_j n_j d_j \cos\left[\arcsin\left(\frac{\sin\theta}{n_j}\right)\right]$$

takes into account all the layers sandwiched between the first electrode and the semi-reflecting mirror layer.

By adjusting the thickness of the organic film layer in the range of the thickness of the organic film layer as defined in the above formula (3), the effective cavity length and the full width at half maximum of the emission peak can be optimized constantly, so that the optimum values of the three unknowns are designed.

In a typical organic light-emitting diode display device, each pixel unit comprises a red (R) sub-pixel unit, a green (G) sub-pixel unit, and a blue (B) sub-pixel unit. In the microcavity structure, the light satisfying the resonant wavelength condition is enhanced by interference. By means of reflection in the microcavity structure, the non-directional light is selected to be light having directivity, resulting in an increase in the light intensity in that particular direction. Therefore, the thickness of the organic film layer needs to correspond to a corresponding sub-pixel unit. For example, the organic film layer corresponding to the red sub-pixel unit is thickest, the organic film layer corresponding to the green sub-pixel unit is thinner, and the organic film layer corresponding to the blue sub-pixel unit is thinnest.

According to another embodiment of the present disclosure, the sub-pixel unit may further comprise a color film layer disposed on the light exit side of the semi-reflecting mirror layer, and the color film layers of the sub-pixel units of different colors of the pixel unit have different colors. The color film layers may be red, green and blue based on the example that each pixel unit comprises a red (R) sub-pixel unit, a green (G) sub-pixel unit and a blue (B) sub-pixel unit.

According to a further embodiment of the present disclosure, the organic film layer may be formed of a low-temperature curing material having a curing temperature of not higher than about 100° C.

According to yet another embodiment of the present disclosure, the low-temperature curing material includes one or more of an epoxy resin, an acrylic resin, a phenol resin, and a polyurethane.

In the above embodiments, an organic film layer with non-uniform thickness can be introduced by a half-tone mask process. As used herein, the term "half-tone mask process" refers to the process that amounts of light transmitted at different positions on the mask are different in the photolithography process since the patterns on the mask have different thicknesses, such that amounts of exposure at different positions on the corresponding organic film layer are different, thus an organic film layer with non-uniform thickness is obtained.

According to an exemplary embodiment of the present disclosure, the thickness of the semi-reflecting mirror layer may be about 100-150 nm.

According to a further embodiment of the present disclosure, the semi-reflecting mirror layer may be a metal layer in which a plurality of holes are regularly arranged. The size, density and arrangement of the holes can be designed according to the desired direction of light. That is, the size, density and arrangement of the holes decide the direction of the light to be enhanced. As a result, the size, density and arrangement of the holes are related to the thickness of the organic film layer. In practice, the thickness of the organic film layer may be designed according to the size, density and arrangement of the holes, or vice versa.

Optionally, the thickness of the first electrode layer may be about 90-100 nm.

Optionally, the thickness of the second electrode layer may be about 100-150 nm.

According to an embodiment of the present disclosure, the sub-pixel unit further comprises an encapsulation layer disposed between the second electrode and the organic film layer, and the thickness of the encapsulation layer is about 3.0-3.5 μm. The encapsulation layer may function as a planarization layer. In case the sub-pixel unit comprises an encapsulation layer, the calculation of the thickness of the above organic film layer needs to take into account the encapsulation layer.

According to another embodiment of the present disclosure, the OLED array substrate further comprises a pixel definition layer disposed between the first electrode and the organic light-emitting layer of each of the sub-pixel units. The pixel definition layer may have a thickness of about 1.0 to 1.5 µm. The pixel definition layer typically has a grid-like structure. The "mesh" of the grid-like structure corresponds to each sub-pixel unit, and the boundary of the mesh is used to delimit each sub-pixel unit. Therefore, the calculation of the thickness of the above organic film layer does not need to take into account the pixel definition layer.

According to a further embodiment of the present disclosure, the thickness of the organic light-emitting layer may be about 200-300 nm.

According to yet another embodiment of the present disclosure, the OLED array substrate further comprises a secondary encapsulation layer disposed on the light exit side of the color film layer of each of the sub-pixel units, and the secondary encapsulation layer has a thickness of about 3.0 to 3.5 µm. Optionally, the secondary encapsulation layer comprises an acrylate-based adhesive and a glass cover.

According to a second aspect of the present disclosure, there is provided an OLED display panel, which may comprise the OLED array substrate described above.

According to a third aspect of the present disclosure, there is provided an OLED display device, which may comprise the OLED display panel described above.

According to a fourth aspect of the present disclosure, there is provided a manufacturing method of an organic light-emitting diode array substrate comprising a plurality of pixel units each including a plurality of sub-pixel units. The manufacturing method comprises:

successively forming, on a base substrate, a first electrode, an organic light-emitting layer, a second electrode, an organic film layer and a semi-reflecting mirror layer corresponding to each sub-pixel unit along the light exit direction of the OLED array substrate, wherein the first electrode comprises a reflective layer, the second electrode is a transparent electrode, a structure between the first electrode and the semi-reflecting mirror layer constitutes a microcavity structure, and the organic film layers of the sub-pixel units of different colors of each pixel unit may have different thicknesses.

In the OLED array substrate manufactured by the above method, light generated by the organic light-emitting layer undergoes reflection, total reflection, diffraction or scattering in the microcavity structure delimited by the first electrode and the semi-reflecting mirror layer. A part of the light exits the semi-reflecting mirror layer, and the direction of the exit light depends on the properties of the semi-reflecting mirror layer. According to the present disclosure, by introducing the microcavity structure, the color purity can be improved, and the luminous efficiency and brightness of the display panel can be enhanced, thereby obtaining a display device with high contrast and low energy consumption. At the same time, the light emitted from the microcavity structure has a good directivity and a high color purity, so that the subsequent black matrix process is not required, which greatly increases the aperture ratio of the display device while saving the cost.

According to an embodiment of the present disclosure, the organic film layers of each sub-pixel unit can be integrally formed by the steps of: spin coating a low-temperature curing organic material, and forming an organic film layer with non-uniform thickness by exposure and development using a half-tone mask.

According to another embodiment of the present disclosure, during the step of forming the organic film layer, the process temperature may be less than about 100° C. so as to prevent damage to the structures of the layers that have been formed.

The OLED display panel according to the second aspect of the present disclosure, the OLED display device according to the third aspect of the present disclosure and the manufacturing method of an OLED array substrate according to the fourth aspect of the present disclosure have the same or corresponding preferred embodiments, advantages and benefits as the OLED array substrate according to the first aspect of the present disclosure, which are not described here for simplicity.

BRIEF DESCRIPTION OF DRAWINGS

These and other aspects of the present disclosure will be apparent from the embodiments described below, and these and other aspects of the present disclosure will be set forth with reference to the embodiments described below. In the drawings.

DETAILED DESCRIPTION

Figure 1:
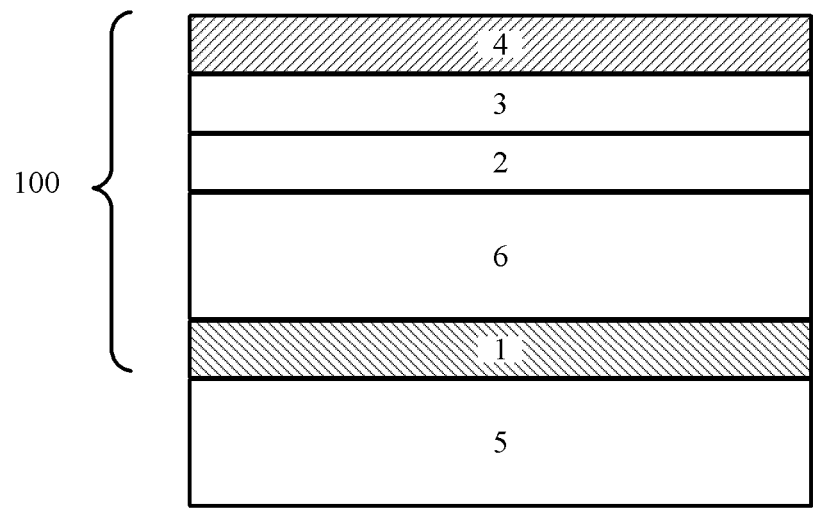
FIG. 1 is a schematic cross-sectional view of a sub-pixel unit of an organic light-emitting diode array substrate according to embodiments of the present disclosure.

While the present disclosure can be construed in many different forms of embodiments, particular embodiments thereof are illustrated in the drawings and described in detail herein based on the following understanding: the present disclosure is to be considered as illustrative description of the principle of the present disclosure. It is not intended to limit the present disclosure to the embodiments described.

It is to be noted that, although the present disclosure is described based on an example of a top-emitting type OLED array substrate in the drawings below and corresponding description thereof, the present disclosure is also applicable to a bottom-emitting type OLED array substrate, as will be readily appreciated by those skilled in the art.

FIG. 1 shows a schematic cross-sectional view of a sub-pixel unit of an OLED array substrate according to embodiments of the present disclosure. The sub-pixel unit comprises a first electrode 1, an organic light-emitting layer 6 and a second electrode 2 disposed successively on a base substrate 5, as well as an organic film layer 3 and a semi-reflecting mirror layer 4 disposed successively on the second electrode 2. The first electrode 1 comprises a reflective layer, for example, the first electrode 1 may be a multi-layer stack structure in which one or more layers of the first electrode 1 furthest from the light exit side may be reflective layers which are made of a metal such as silver or aluminum. Alternatively, the first electrode 1 may also be a single-layer reflective layer, which may also be made of a metal such as silver or aluminum. The second electrode 2 is a transparent electrode (for example, made of indium tin oxide (ITO)). A structure between the semi-reflecting mirror layer 4 and the first electrode 1 constitutes a microcavity structure 100. According to the present embodiment, introducing the microcavity structure to the OLED array substrate can improve the color purity and enhance the luminous efficiency and brightness, thereby obtaining a display device with high contrast and low energy consumption. At the same time, light emitted from the microcavity structure has good directivity and high color purity, so that the subsequent black matrix process is not required, which greatly increases the aperture ratio of the display device while saving the cost. Further, the organic film layer is formed of a low-temperature curing material having a curing temperature of not more than about 100° C. The selection of the low-temperature curing material to form the organic film layer 3 can prevent an organic light-emitting layer 6 from being destroyed in a high temperature process. The low-temperature curing material includes one or more of an epoxy resin, an acrylic resin, a phenol resin, and a polyurethane.

The microcavity structure 100 is designed according to the effective cavity length of the microcavity structure 100, the full width at half maximum of the emission peak and the Fabry-Perot formula. Specifically, the effective cavity length $L(\lambda)$ of the microcavity structure is calculated by the following formula:

$$L(\lambda) \approx \frac{\lambda}{2}\left(\frac{R}{\Delta n}\right) + \sum_j n_j d_j \cos\theta + \left|\frac{\Phi_m}{4\pi}\lambda\right| \quad (1)$$

where $\lambda$ is a resonant wavelength of light emitted from the light-emitting portion, R is an effective reflectance of the first electrode, $\Delta n$ is a difference between refractive indexes of two materials that form the semi-reflecting mirror layer 4 and the first electrode 1, $n_j$ and $d_j$ are a refractive index and a thickness of the material of the j-th layer, respectively, $\Phi_m$ is a reflection-induced retardance of light on the semi-reflecting mirror layer 4, and the term $$\sum_j n_j d_j \cos\theta$$

needs to take into account all the layers sandwiched between the first electrode 1 and the semi-reflecting mirror layer 4. The sub-pixel unit shown in FIG. 1 is taken as an example, which comprises the organic light-emitting layer 6, the second electrode 2, and the organic film layer 3. It is to be noted that the term "effective cavity length" as used herein refers to the effective length of the microcavity structure 100 in the reflective sense, rather than simply a simple superposition of the thicknesses of the layers that constitute the microcavity structure 100.

The full width at half maximum $\Delta\lambda$ of the emission peak is calculated by the following formula:

$$\Delta\lambda = \frac{\lambda^2}{2nL(\lambda)} \times \frac{1 - \sqrt{R_1 R_2}}{\pi(R_1 R_2)^{1/4}} \quad (2)$$

where $\lambda$ is a resonant wavelength of light emitted from the light-emitting portion, R is an effective reflectance of the first electrode 1, $L(\lambda)$ is the effective cavity length of the microcavity structure calculated according to the formula (1), and $R_1$, $R_2$ are specular reflectances of the first electrode 1 and the semi-reflecting mirror layer 4, respectively.

The Fabry-Perot formula is:

$$(\varphi_1 + \varphi_2) + \frac{4\pi}{\lambda}\sum_j n_j d_j \cos\left[\arcsin\left(\frac{\sin\theta}{n_j}\right)\right] = 2m\pi \quad (3)$$

where m is a nonnegative integer (e.g. 1, 2, etc), $\varphi_1$ and $\varphi_2$ are reflection-induced retardances of the first electrode 1 and the semi-reflecting mirror layer 4, the units of which are radian, $n_j$ and $d_j$ are a refractive index and a thickness of the j-th layer, respectively, $$\arcsin\left(\frac{\sin\theta}{n_j}\right)$$

is an angle of light in the j-th layer measured from a normal line perpendicular to the plane of the light-emitting device, $\lambda$ is a resonant wavelength of light emitted from the light-emitting portion, and the term $$\frac{4\pi}{\lambda}\sum_j n_j d_j \cos\left[\arcsin\left(\frac{\sin\theta}{n_j}\right)\right]$$

needs to take into account all the layers sandwiched between the first electrode 1 and the semi-reflecting mirror layer 4. The sub-pixel unit shown in FIG. 1 is also taken as an example, which comprises the organic light-emitting layer 6, the second electrode 2, and the organic film layer 3.

By adjusting the thickness of the organic film layer in the range of the thickness of the organic film layer as defined in the above formula (3), the effective cavity length and the full width at half maximum of the emission peak can be optimized constantly, so that the optimum values of the three unknowns are designed.

Figure 2:
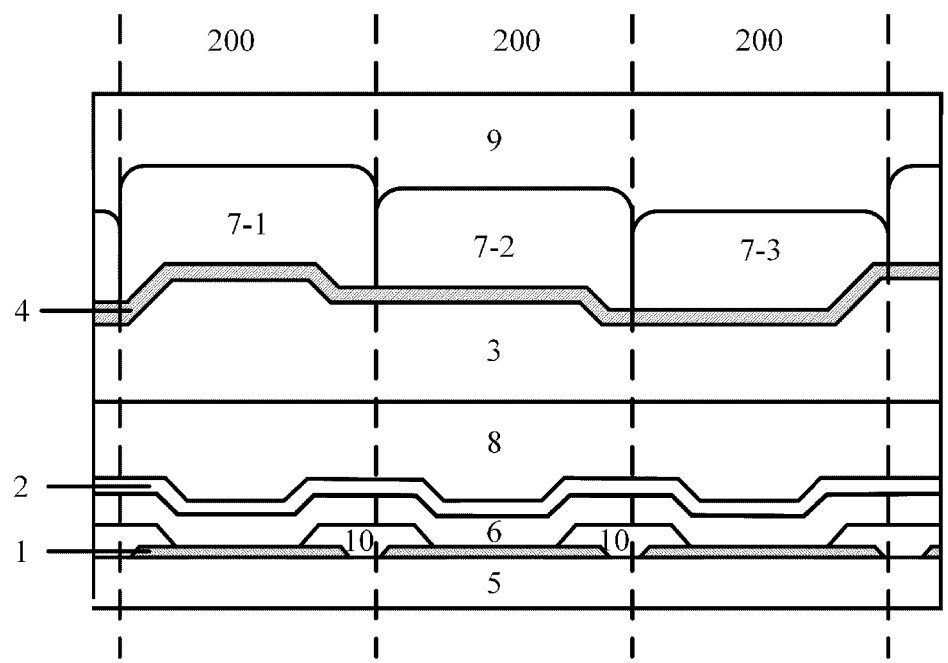
FIG. 2 is a schematic cross-sectional view of an organic light-emitting diode array substrate according to embodiments of the present disclosure.

FIG. 2 shows a schematic cross-sectional view of an organic light-emitting diode array substrate according to embodiments of the present disclosure. As shown in the figure, the array substrate comprises a plurality of pixel units (one pixel unit is schematically illustrated in FIG. 2) each including a plurality of sub-pixel units 200. Each sub-pixel unit 200 comprises color film layers 7-1, 7-2 and 7-3 disposed over the semi-reflecting mirror layer 4, wherein the color film layers 7-1, 7-2 and 7-3 of the sub-pixel units 200 of different colors have different colors. According to the present embodiment, the color film layer is directly made on the microcavity structure 100, which can improve the precision in alignment between the color film layer and the sub-pixel unit. At the same time, the thickness of the OLED array substrate is reduced.

As shown in the figure, the organic film layers 3 of the sub-pixel units 200 to which the color film layers 7-1, 7-2 and 7-3 of different colors correspond have different thicknesses. Each pixel unit comprising a red (R) sub-pixel unit, a green (G) sub-pixel unit, and a blue (B) sub-pixel unit is used as an example. In the microcavity structure, the light satisfying the resonant wavelength condition is enhanced by interference. By means of reflection in the microcavity structure, the non-directional light is selected to be light having directivity, resulting in an increase in the light intensity in that particular direction. Therefore, the thickness of the organic film layer needs to correspond to a corresponding sub-pixel unit. For example, the organic film layer corresponding to the red sub-pixel unit is thickest, the organic film layer corresponding to the green sub-pixel unit is thinner, and the organic film layer corresponding to the blue sub-pixel unit is thinnest.

The semi-reflecting mirror layer 4 is formed of a metal layer in which a plurality of holes are arranged (not shown in FIG. 2). The size and density of the holes can be designed according to the desired light exit direction. That is, the size and density of the holes decide the direction of the light to be enhanced. As a result, the size and density of the holes are related to the thickness of the organic film layer. In practice, the thickness of the organic film layer may be designed according to the size and density of the holes, or vice versa. A plurality of holes may be regularly arranged in the metal layer. Similarly, the arrangement of the holes may be designed according to the desired light exit direction.

As shown in FIG. 2, the sub-pixel unit 200 further comprises an encapsulation layer 8 disposed between the second electrode 2 and the organic film layer 3, which may function as a planarization layer. The OLED array substrate further comprises a pixel definition layer 10 disposed over the first electrodes 1 of respective sub-pixel units 200. In this case, the design of the microcavity structure 100 further needs to take into account the encapsulation layer 8.

Optionally, the organic light-emitting layer 6 may comprise an electron injection layer (not shown). At that time, the design of the microcavity structure 100 further needs to take into account the electron injection layer.

Further, as shown in FIG. 2, the OLED array substrate further comprises a secondary encapsulation layer 9 disposed over the color film layers 7 of respective sub-pixel units. Optionally, the secondary encapsulation layer 9 may comprise an acrylate-based adhesive and a glass cover. The thickness of the secondary encapsulation layer 9 is about 3.0 to 3.5 μm.

In one example design, the thickness of the semi-reflecting mirror layer 4 is about 100 to 150 nm, the thickness of the first electrode 1 is about 90 to 100 nm, the thickness of the pixel definition layer 10 may be about 1.0 to 1.5 μm, the thickness of the organic light-emitting layer 6 is about 200 to 300 nm, the thickness of the second electrode 2 is about 100 to 150 nm, and the thickness of the encapsulation layer 8 is about 3.0 to 3.5 μm. Accordingly, the thickness of the organic film layer 3 in the regions corresponding to the sub-pixels of different colors can be calculated. According to the present embodiment, introducing the microcavity structure to the OLED array substrate can improve the color purity and enhance the luminous efficiency and brightness, thereby obtaining a display device with high contrast and low energy consumption. At the same time, light emitted from the microcavity structure has good directivity and high color purity, so that the subsequent black matrix process is not required, which greatly increases the aperture ratio of the display device while saving the cost.

Figure 3:
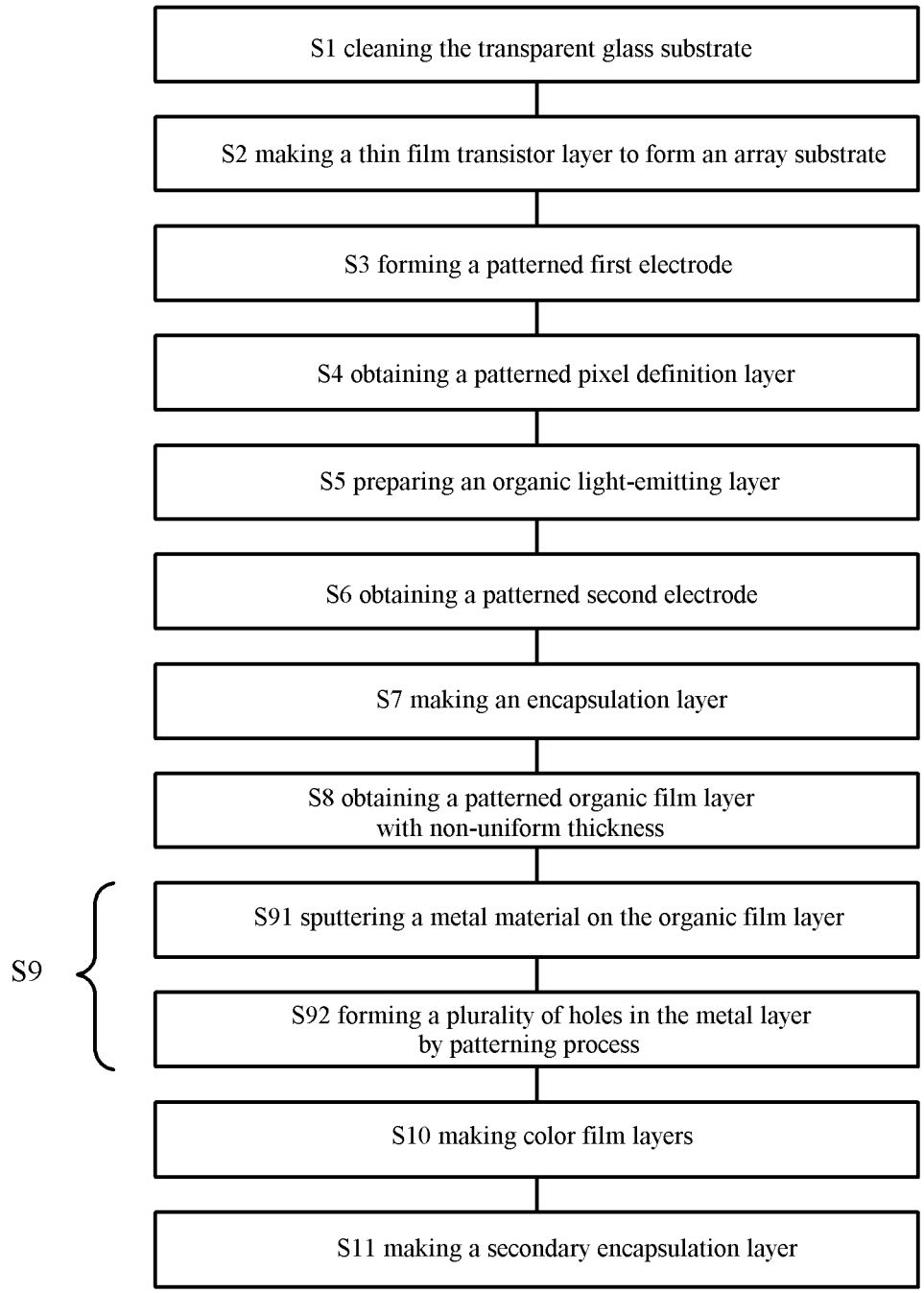
FIG. 3 is a flow chart of a method of manufacturing an organic light-emitting diode array substrate according to embodiments of the present disclosure.

FIG. 3 illustrates a flow chart of a method of manufacturing the organic light-emitting diode array substrate according to embodiments. As shown in FIG. 3, the method comprises the steps of:

S1: cleaning the transparent glass substrate using standard methods;

S2: making a thin film transistor layer on the cleaned transparent glass substrate to form an array substrate;

S3: forming a patterned first electrode on the prepared array substrate by sputtering, spin coating, exposure, development, etching, peeling, and the like, wherein the patterned first electrode has a good reflectivity (for example, including a metal layer) and may have a thickness of about 90-100 nm;

S4: obtaining a patterned pixel definition layer by spin coating, exposure and development, which may have a thickness of about 1.0 to 1.5 μm;

S5: preparing an organic light-emitting layer by vapor deposition process, which may have a thickness of about 200-300 nm;

S6: obtaining a patterned second electrode by sputtering, spin coating, exposure, development, etching, peeling, and the like, which has a better permeability (for example, made of a transparent conductive material such as indium tin oxide (ITO)) and may have a thickness of about 100 to 150 nm;

S7: making an encapsulation layer, which may have a thickness of about 3.0 to 3.5 μm;

S8: obtaining a patterned organic film layer with non-uniform thicknesses by spin coating, and exposure and development based on a half-tone mask process, wherein in order to protect the light-emitting layer from damage, the organic film layer employs a low-temperature curing material, and the process temperature of this step needs to be less than about 100° C. The thickness of the organic film layer is calculated by the manner mentioned above;

S9: obtaining a patterned semi-reflecting mirror layer by sputtering, spin coating, exposure, development, etching, peeling, and the like, wherein a portion of the semi-reflecting mirror layer has good light transmittance and the other portion has good reflectivity, and the thickness thereof may be about 100-150 nm;

S10: making color film layers, which are in one-to-one correspondence with the sub-pixel units;

S11: making a secondary encapsulation layer, which may have a thickness of about 3.0 to 3.5 μm.

The step S9 of obtaining the semi-reflecting mirror layer may include the sub-steps of:

S91: sputtering a metal material on the organic film layer; and

S92: forming a plurality of holes in the metal layer by patterning process.

While the present disclosure has been illustrated and described in detail in the drawings and the foregoing description, such illustration and description are to be regarded as illustrative or exemplary rather than restrictive. The present disclosure is not limited to the disclosed embodiments. Those skilled in the art will be able to understand and implement other variations of the disclosed embodiments by studying the drawings, the disclosure, and the appended claims when practicing the claimed disclosure. For example, the methods described above do not require the desired results to be achieved in the order of the particular order or sequence described. Other steps may be provided, or the steps may be removed from the described method, and other components may be added to the described device or removed from the described device. Other embodiments may be within the scope of the present disclosure.

The invention claimed is:

1. An OLED array substrate comprising a plurality of pixel units each including a plurality of sub-pixel units, each of the sub-pixel units comprising a light-emitting portion, each light-emitting portion having a first electrode, a second electrode, and an organic light-emitting layer sandwiched between the first electrode and the second electrode, wherein the first electrode is located further from a light exit side than the second electrode, wherein each sub-pixel unit further comprises an organic film layer and a semi-reflecting mirror layer disposed successively on a light exit side of the second electrode, the first electrode comprises a reflective layer, the second electrode is a transparent electrode, a structure between the first electrode and the semi-reflecting mirror layer constitutes a microcavity structure, and organic film layers of the sub-pixel units of different colors of each pixel unit have different thicknesses, and wherein in each sub-pixel unit, the semi-reflecting mirror layer is a metal layer in which a plurality of holes are regularly arranged, and size, density and arrangement of the plurality of holes are related to a thickness of the organic film layer.

2. The OLED array substrate according to claim 1, wherein the thickness of the organic film layer is designed according to an effective cavity length of the microcavity structure, a full width at half maximum of an emission peak and the Fabry-Perot formula, wherein the effective cavity length $L(\lambda)$ of the microcavity structure is calculated by the following formula:

$$L(\lambda) \approx \frac{\lambda}{2}\left(\frac{R}{\Delta n}\right) + \sum_j n_j d_j \cos\theta + \left|\frac{\Phi_m}{4\pi}\lambda\right| \quad (1)$$

where $\lambda$ is a resonant wavelength of light emitted from a corresponding light-emitting portion, R is an effective reflectance of the first electrode, $\Delta n$ is a difference between refractive indexes of two materials that form the semi-reflecting mirror layer and the first electrode, $n_j$ and $d_j$ are a refractive index and a thickness of a material of a j-th layer, respectively, $\Phi_m$ is a reflection-induced retardance of light on the semi-reflecting mirror layer and a term $$\sum_j n_j d_j \cos\theta$$

takes into account all the layers sandwiched between the first electrode and the semi-reflecting mirror layer, the full width at half maximum $\Delta\lambda$ of the emission peak is calculated by the following formula:

$$\Delta\lambda = \frac{\lambda^2}{2nL(\lambda)} \times \frac{1 - \sqrt{R_1 R_2}}{\pi(R_1 R_2)^{1/4}} \quad (2)$$

where $\lambda$ is a resonant wavelength of light emitted from a corresponding light-emitting portion, R is an effective reflectance of the first electrode, $L(\lambda)$ is the effective cavity length of the microcavity structure calculated according to the formula (1), and $R_1$, $R_2$ are specular reflectances of the first electrode and the semi-reflecting mirror layer, respectively, the Fabry-Perot formula is:

$$(\varphi_1 + \varphi_2) + \frac{4\pi}{\lambda}\sum_j n_j d_j \cos\left[\arcsin\left(\frac{\sin\theta}{n_j}\right)\right] = 2m\pi \quad (3)$$

where m is a nonnegative integer, $\varphi_1$ and $\varphi_2$ are reflection-induced retardances of the first electrode and the semi-reflecting mirror layer, the units of which are radian, $n_j$ and $d_j$ are a refractive index and a thickness of a j-th layer, respectively, $$\arcsin\left(\frac{\sin\theta}{n_j}\right)$$

is an angle of light in the j-th layer measured from a normal line perpendicular to a plane of the light-emitting portion, $\lambda$ is a resonant wavelength of light emitted from the light-emitting portion, and a term $$\frac{4\pi}{\lambda}\sum_j n_j d_j \cos\left[\arcsin\left(\frac{\sin\theta}{n_j}\right)\right]$$

takes into account all the layers sandwiched between the first electrode and the semi-reflecting mirror layer.

3. The OLED array substrate according to claim 1, wherein the sub-pixel unit further comprises a color film layer disposed on a light exit side of the semi-reflecting mirror layer, and color film layers of the sub-pixel units of different colors of the pixel unit have different colors.

4. The OLED array substrate according to claim 3, further comprising a secondary encapsulation layer disposed on a light exit side of the color film layer of each of the sub-pixel units, the secondary encapsulation layer having a thickness of about 3.0 to 3.5 μm.

5. The OLED array substrate according to claim 4, wherein the secondary encapsulation layer includes an acrylate-based adhesive and a glass cover.

6. The OLED array substrate according to claim 1, wherein the organic film layer is formed of a low-temperature curing material, and the low-temperature curing material has a curing temperature of not higher than about 100° C.

7. The OLED array substrate according to claim 6, wherein the low-temperature curing material includes one or more of an epoxy resin, an acrylic resin, a phenol resin, and a polyurethane.

8. The OLED array substrate according to claim 1, wherein the semi-reflecting mirror layer has a thickness of about 100 to 150 nm.

9. The OLED array substrate according to claim 1, wherein the first electrode has a thickness of about 90 to 100 nm.

10. The OLED array substrate according to claim 1, wherein the second electrode has a thickness of about 100 to 150 nm.

11. The OLED array substrate according to claim 1, wherein the sub-pixel unit further comprises an encapsulation layer disposed between the second electrode and the organic film layer, the encapsulation layer having a thickness of about 3.0 to 3.5 μm, and the microcavity structure further comprising the encapsulation layer.

12. The OLED array substrate according to claim 1, further comprising a pixel definition layer disposed between the first electrode and the organic light-emitting layer of each of the sub-pixel units, wherein the pixel definition layer has a thickness of about 1.0 to 1.5 μm.

13. The OLED array substrate according to claim 1, wherein the organic light-emitting layer has a thickness of about 200 to 300 nm.

14. An OLED display panel comprising the OLED array substrate according to claim 1.

15. The OLED display panel according to claim 14, wherein the thickness of the organic film layer is designed according to an effective cavity length of the microcavity structure, a full width at half maximum of an emission peak and the Fabry-Perot formula, wherein the effective cavity length L(2) of the microcavity structure is calculated by the following formula:

$$L(\lambda) \approx \frac{\lambda}{2}\left(\frac{R}{\Delta n}\right) + \sum_j n_j d_j \cos\theta + \left|\frac{\Phi_m}{4\pi}\lambda\right| \quad (1)$$

where $\lambda$ is a resonant wavelength of light emitted from a corresponding light-emitting portion, R is an effective reflectance of the first electrode, $\Delta n$ is a difference between refractive indexes of two materials that form the semi-reflecting mirror layer and the first electrode, $n_j$ and $d_j$ are a refractive index and a thickness of a material of a j-th layer, respectively, $\Phi_m$ is a reflection-induced retardance of light on the semi-reflecting mirror layer, and a term $$\sum_j n_j d_j \cos\theta$$

takes into account all the layers sandwiched between the first electrode and the semi-reflecting mirror layer, the full width at half maximum $\Delta\lambda$ of the emission peak is calculated by the following formula:

$$\Delta\lambda = \frac{\lambda^2}{2nL(\lambda)} \times \frac{1-\sqrt{R_1 R_2}}{\pi(R_1 R_2)^{1/4}} \quad (2)$$

where $\lambda$ is a resonant wavelength of light emitted from a corresponding light-emitting portion, R is an effective reflectance of the first electrode, $L(\lambda)$ is the effective cavity length of the microcavity structure calculated according to the formula (1), and $R_1$, $R_2$ are specular reflectances of the first electrode and the semi-reflecting mirror layer, respectively, the Fabry-Perot formula is:

$$(\varphi_1 + \varphi_2) + \frac{4\pi}{\lambda}\sum_j n_j d_j \cos\left[\arcsin\left(\frac{\sin\theta}{n_j}\right)\right] = 2m\pi \quad (3)$$

where m is a nonnegative integer, $\varphi_1$ and $\varphi_2$ are reflection-induced retardances of the first electrode and the semi-reflecting mirror layer, the units of which are radian, $n_j$ and $d_j$ are a refractive index and a thickness of a j-th layer, respectively, $$\arcsin\left(\frac{\sin\theta}{n_j}\right)$$

is an angle of light in the j-th layer measured from a normal line perpendicular to a plane of the light-emitting portion, $\lambda$ is a resonant wavelength of light emitted from the light-emitting portion, and a term $$\frac{4\pi}{\lambda}\sum_j n_j d_j \cos\left[\arcsin\left(\frac{\sin\theta}{n_j}\right)\right]$$

takes into account all the layers sandwiched between the first electrode and the semi-reflecting mirror layer.

16. The OLED display panel according to claim 14, wherein the sub-pixel unit further comprises a color film layer disposed on a light exit side of the semi-reflecting mirror layer, and color film layers of the sub-pixel units of different colors of the pixel unit have different colors.

* * * * *